United States Patent
Kyoto et al.

(10) Patent No.: US 10,958,043 B2
(45) Date of Patent: Mar. 23, 2021

(54) LASER DEVICE

(71) Applicant: Mitsubishi Electric Corporation, Tokyo (JP)

(72) Inventors: Tomohiro Kyoto, Tokyo (JP); Tomotaka Katsura, Tokyo (JP); Daisuke Morita, Tokyo (JP); Hiroyuki Takeuchi, Tokyo (JP); Yumi Genda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/043,689

(22) PCT Filed: Apr. 2, 2018

(86) PCT No.: PCT/JP2018/014166
§ 371 (c)(1),
(2) Date: Sep. 30, 2020

(87) PCT Pub. No.: WO2019/193640
PCT Pub. Date: Oct. 10, 2019

(65) Prior Publication Data
US 2021/0057887 A1    Feb. 25, 2021

(51) Int. Cl.
*H01S 5/40* (2006.01)
*H01S 5/00* (2006.01)
*H01S 5/026* (2006.01)

(52) U.S. Cl.
CPC .......... *H01S 5/4087* (2013.01); *H01S 5/0028* (2013.01); *H01S 5/0265* (2013.01); *H01S 5/4012* (2013.01)

(58) Field of Classification Search
CPC .... H01S 5/4087; H01S 5/0028; H01S 5/0265; H01S 5/4012; H01S 5/0071; H01S 5/0617; H01S 5/06825
See application file for complete search history.

(56) References Cited

U.S. PATENT DOCUMENTS

2011/0255564 A1    10/2011  Chihara
2016/0367124 A1    12/2016  Nishio
(Continued)

FOREIGN PATENT DOCUMENTS

JP     2005-317841 A    11/2005
JP     2006-303365 A    11/2006
(Continued)

OTHER PUBLICATIONS

International Search Report and Written Opinion dated May 29, 2019 for PCT/JP2018/014166 filed on Apr. 2, 2018, 9 pages including English Translation of the International Search Report.
(Continued)

*Primary Examiner* — Armando Rodriguez
(74) *Attorney, Agent, or Firm* — Xsensus LLP (57) ABSTRACT

A laser device includes a plurality of laser diodes that generate laser light beams having different wavelengths from each other, a partial reflective mirror constituting a resonator along with the laser diodes, a wavelength dispersive element set in the resonator, which combines parts of the laser light beams outputted by the laser diodes to each other, emits the combined parts of the laser light beams as a first laser light beam toward the partial reflective mirror, and emits other parts of the laser light beams as second laser light beams in directions different from the direction toward the partial reflective mirror, and an output detecting unit detecting intensities of the second laser light beams.

16 Claims, 6 Drawing Sheets

(56) References Cited

U.S. PATENT DOCUMENTS

2017/0153458 A1  6/2017  Mitamura
2017/0304942 A1  10/2017  Ogata
2019/0252844 A1  8/2019  Nishimae et al.

FOREIGN PATENT DOCUMENTS

| JP | 2007-148220 A | 6/2007 |
| JP | 2010-134976 A | 6/2010 |
| JP | 2011-228457 A | 11/2011 |
| JP | 2013-145819 A | 7/2013 |
| JP | 2015-170708 A | 9/2015 |
| JP | 2015-195271 A | 11/2015 |
| JP | 2016-054295 A | 4/2016 |
| JP | 2016-078050 A | 5/2016 |
| JP | 2016-112609 A | 6/2016 |
| JP | 2017-098505 A | 6/2017 |
| JP | 6223650 B1 | 11/2017 |
| WO | 2008/045653 A2 | 4/2008 |
| WO | 2015/155895 A1 | 10/2015 |
| WO | 2018/020709 A1 | 2/2018 |

OTHER PUBLICATIONS

Decision to Grant received for Japanese Patent Application No. 2018-541451, dated Oct. 16, 2018, 5 pages including English Translation.

LASER DEVICE

CROSS-REFERENCE TO RELATED APPLICATION

The present application is based on PCT filing PCT/JP2018/014166, filed Apr. 2, 2018, the entire contents of which are incorporated herein by reference.

FIELD

The present invention relates to a laser device that oscillates light having a plurality of wavelengths based on the use of a plurality of laser diodes.

BACKGROUND

In a field of a laser processing device that performs processing using a laser beam, in recent years, there has been developed a laser processing device that uses a laser oscillator using two or more laser diodes as a laser light source. Patent Literature 1 discloses a laser processing device that oscillates light having a plurality of wavelengths using a plurality of laser diodes. Since the intensity of a laser beam outputted may decrease due to deterioration of a laser diode and the like, the laser processing device has a function of detecting the intensity of laser beam.

CITATION LIST

Patent Literature

Patent Literature 1: Japanese Patent Application Laid-open No. 2016-78050

SUMMARY

Technical Problem

However, the laser processing device described in Patent Literature 1 has a problem in that its device size is large because optical components such as a dispersive element and a spectroscopic element are newly added to the device for purpose of detecting the intensity of a laser beam.

The present invention has been achieved in view of the above circumstances, and an object of the present invention is to provide a laser device that can prevent increase in device size.

Solution to Problem

In order to solve the above-mentioned problems and achieve the object, the present invention provides a laser device comprising: a plurality of laser diodes to generate laser light beams having their respective wavelengths different from each other; a partial reflective mirror by which a resonator is formed along with the laser diodes; a wavelength dispersive element placed in the resonator, to combine parts of the laser light beams outputted by the laser diodes with each other, emit the laser light beams obtained by the combination as a first laser light beam toward the partial reflective mirror, and emit other parts of the laser light beams as second laser light beams in directions different from the direction toward the partial reflective mirror; and an output detecting unit to detect intensities of the second laser light beams.

Advantageous Effects of Invention

The laser device according to the present invention has an advantageous effect of making it possible to prevent increase in device size.

DESCRIPTION OF EMBODIMENTS

A laser device according to embodiments of the present invention will be described in detail below with reference to the drawings. The present invention is not necessarily limited by these embodiments.

First Embodiment

Figure 1:
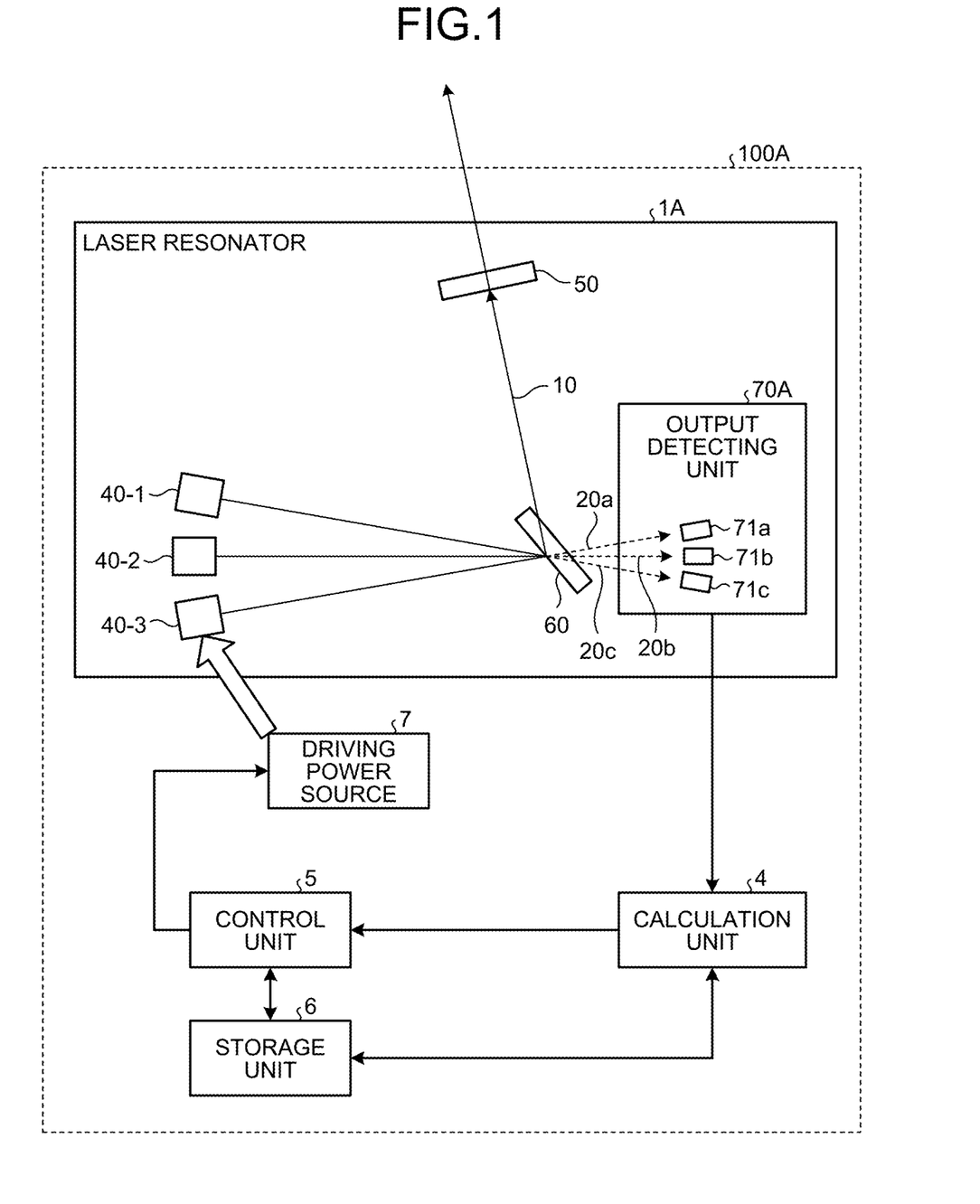
FIG. 1 is a diagram illustrating a configuration of a laser device according to a first embodiment of the present invention.

FIG. 1 is a diagram illustrating a configuration of a laser device 100A according to a first embodiment of the present invention. The laser device 100A includes a laser resonator 1A, a calculation unit 4, a control unit 5, a storage unit 6, and a driving power source 7.

The laser resonator 1A includes laser diodes 40-1, 40-2, and 40-3, a partial reflective mirror 50, a wavelength dispersive element 60, and an output detecting unit 70A. In the following descriptions, the laser diodes 40-1, 40-2, and 40-3 are simply called "laser diodes 40" when it is not necessary to distinguish them from each other. The two or more laser diodes can generate laser light beams having their respective wavelengths different from each other. The laser diodes 40 and the partial reflective mirror 50 constitute a resonator. The laser light beams outputted from the two or more laser diodes 40 are subjected to repetitive reflection between the laser diodes 40 and the partial reflective mirror 50 and are amplified, and thereafter a partial light thereof is taken out from the partial reflective mirror 50.

The wavelength dispersive element 60 is placed in the resonator constituted by the laser diodes 40 and the partial reflective mirror 50. The wavelength dispersive element 60 is a diffraction grating, for example. The wavelength dispersive element 60 diffracts two or more laser light beams emitted from the two or more laser diodes 40, and separates the laser light beams into different orders. In the example illustrated in FIG. 1, the wavelength dispersive element 60 is a transmission type diffractive grating, which combines first-order diffracted light beams of the laser light beams into a first laser light beam 10 and emits it toward the partial reflective mirror 50, while emitting zero-order diffracted light beams as second laser light beams 20a, 20b, and 20c in directions different from the direction toward the partial reflective mirror 50. In the following descriptions, the second laser light beams 20a, 20b, and 20c are simply called "second laser light beams 20" when it is not necessary to distinguish them from each other. In FIG. 1, arrows represent light traveling directions in which light beams respectively emitted by the laser diodes 40-1, 40-2, and 40-3 are diffracted by the wavelength dispersive element 60, and are separated into different orders. When a light ray reflected by the partial reflective mirror 50 is incident on the wavelength dispersive element 60, the wavelength dispersive element 60 separates the incident light beam into light rays having respective wavelengths and emits them toward the laser diodes 40-1, 40-2, and 40-3, respectively. Each laser diode 40 is provided with a reflective mirror that reflects the light beam that has been subjected to the reflection on the partial reflective mirror 50 and then separated by the wavelength dispersive element 60.

The laser diode 40-1 outputs a laser light beam with a wavelength $\lambda 1$, the laser diode 40-2 outputs a laser light beam with a wavelength $\lambda 2$, and the laser diode 40-3 outputs a laser light beam with a wavelength $\lambda 3$. In this case, the first laser light beam 10 contains light components with the wavelengths $\lambda 1$, $\lambda 2$, and $\lambda 3$, the second laser light beam 20a is a light component with the wavelength $\lambda 3$, the second laser light beam 20b is a light component with the wavelength $\lambda 2$, and the second laser light beam 20c is a light component with the wavelength $\lambda 1$.

The output detecting unit 70A detects the intensity of each second laser light beam 20. The output detecting unit 70A includes a plurality of output measurement sensors 71a, 71b, and 71c. In the following descriptions, the output measurement sensors 71a, 71b, and 71c are simply called "output measurement sensors 71" when it is not necessary to distinguish them from each other. The two or more output measurement sensors 71 are respectively placed on optical paths of the two or more second laser light beams 20a, 20b, and 20c incident on the output detecting unit 70A, respectively. For example, the output measurement sensor 71a is set on the optical path of the second laser light beam 20a, the output measurement sensor 71b is set on the optical path of the second laser light beam 20b, and the output measurement sensor 71c is set on the optical path of the second laser light beam 20c. The two or more output measurement sensors 71a, 71b, and 71c have their respective sensitivity characteristics different from each other, the sensitivity characteristics each exhibiting a light-receiving sensitivity with respect to a wavelength of a laser light beam. The sensitivity characteristics indicate the light-receiving sensitivities with respect to the wavelengths of the laser light beams, respectively. The output measurement sensors 71 detect the intensities of the second laser light beams 20 having their respective wavelengths, and output detection signals indicating the detected intensities, respectively.

The output detecting unit 70A outputs detection signals indicating the detected intensities of the second laser light beams 20 to the calculation unit 4. The calculation unit 4 calculates driving voltages to be applied to the laser diodes 40-1, 40-2, and 40-3, respectively, by the driving power source 7, based on the detection signals outputted by the output detecting unit 70A. Specifically, in order to compensate for reduction in intensity of the laser diodes 40, the calculation unit 4 calculates the driving voltage to be applied to the laser diode 40 such that the intensity of the laser light beam outputted by each of the laser diodes 40 is made close to a target value. The calculation unit 4 outputs a signal indicating the driving voltages obtained by its calculation to the control unit 5.

The control unit 5 controls the driving power source 7 in accordance with the signal indicating the driving voltages outputted by the calculation unit 4. The storage unit 6 stores therein various kinds of parameters and the like to be used for the control unit 5 to control the driving power source 7. The driving power source 7 supplies electric power to each of the laser diodes 40-1, 40-2, and 40-3 in accordance with control of the control unit 5. While the calculation unit 4 calculates the driving voltage to be applied to each of the laser diodes 40 in the above example, the calculation unit 4 may calculate a driving voltage such that the outputs of the laser diodes 40 are entirely controlled in a series connection manner.

The control unit 5 can also cause the storage unit 6 to store therein the intensities of the second laser light beams 20 detected by the output detecting unit 70A as state information of the laser device 100A. Further, the control unit 5 can detect abnormality of the laser device 100A based on the intensities of the second laser light beams 20 detected by the output detecting unit 70A. For example, when detecting the fact that the intensity of any of the second laser light beams 20 has been reduced by a threshold or more, the control unit 5 determines that abnormality has occurred in the laser device 100A, and can notify a user of the abnormality or stop the operation of the laser device 100A.

As described above, according to the laser device 100A of the first embodiment of the present invention, two or more laser diodes 40 and the partial reflective mirror 50 form a resonator, and the wavelength dispersive element 60 is set in the resonator. The wavelength dispersive element 60 emits the first laser light beam obtained by combining parts of two or more laser light beams outputted by the laser diodes 40 toward the partial reflective mirror 50, and emits the second laser light beams that are remaining parts of the laser light beams in directions different from the direction toward the partial reflective mirror 50. The output detecting unit 70A detects the intensities of the second laser light beams 20.

According to the configuration described above, the laser device 100A generates a light ray used to monitor the intensity by using a wavelength dispersive element configured to combine light beams having two or more wavelengths, and therefore it is possible to prevent increase in device size of the laser device 100A without newly adding any optical components such as a dispersive element and a spectroscopic element for detecting the intensity of laser light. Further, a component such as a dispersive element is expensive in many cases. Therefore, it is possible to reduce the number of expensive components and also possible to save the manufacturing cost.

Further, the output detecting unit 70A of the laser device 100A includes a plurality of output measurement sensors 71a, 71b, and 71c. The output measurement sensors 71a, 71b, and 71c are placed on optical paths of the second laser light beams 20a, 20b, and 20c for their respective wavelengths, respectively, and measure the intensities of the second laser light beams 20a, 20b, and 20c, respectively. Accordingly, the laser device 100A can detect the intensities of laser light beams for each wavelength separately. Therefore, it is possible to manage the output of the laser device 100A for each wavelength, so that the sensor sensitivity can be made appropriate and stable output detection can be realized.

Further, because the output detecting unit 70A can detect the intensity of a laser light beam for each wavelength, the laser device 100A can control the outputs of the laser diodes 40 based on the detected intensities of the second laser light beams 20. The laser device 100A may record the detected intensities of the second laser light beams 20 as state information of the laser device 100A. By recording the detected intensities as state information of the laser device 100A, it becomes possible to recognize the variation of the output of the laser device 100A.

Second Embodiment

Figure 2:
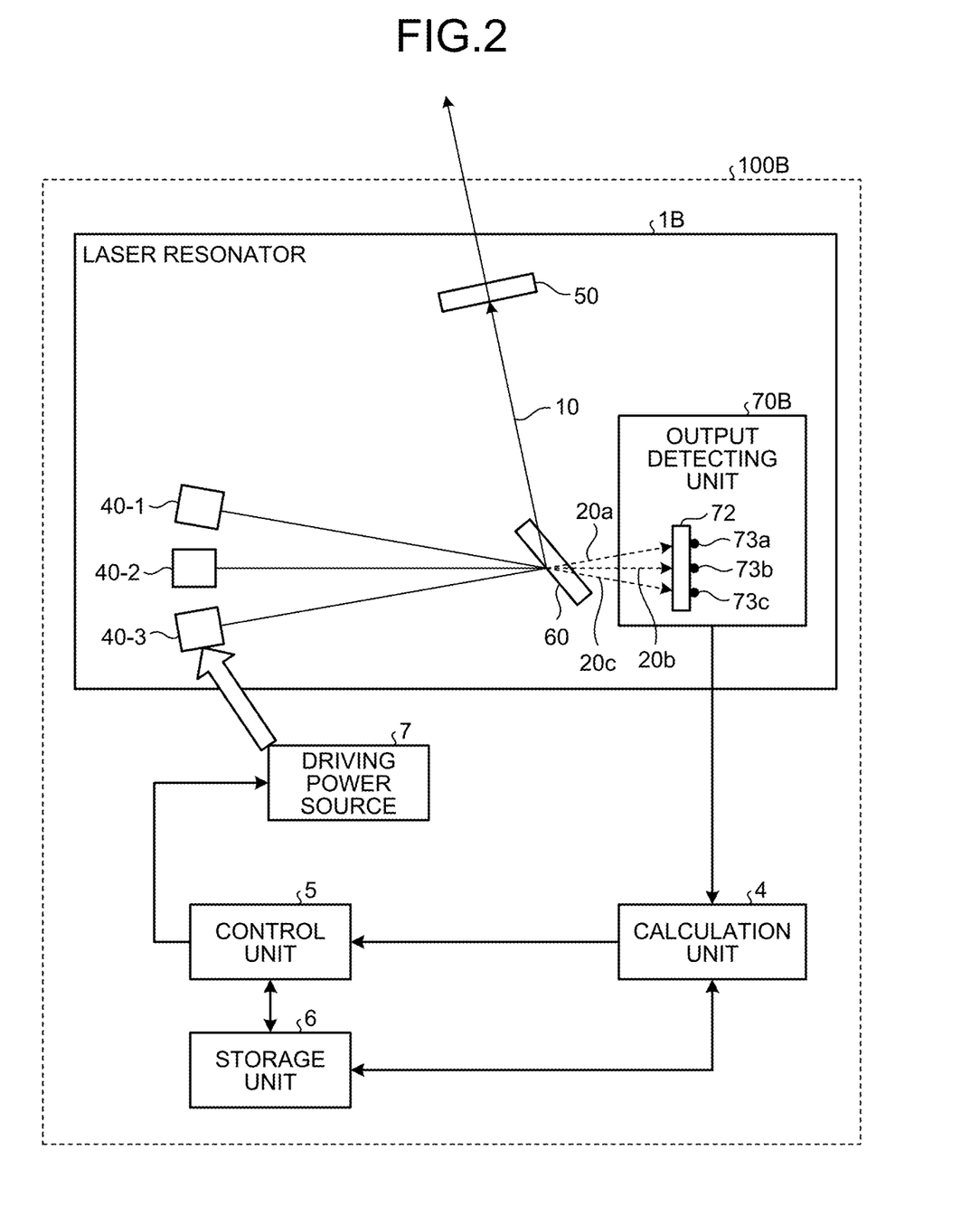
FIG. 2 is a diagram illustrating a configuration of a laser device according to a second embodiment of the present invention.

FIG. 2 is a diagram illustrating a configuration of a laser device 100B according to a second embodiment of the present invention. The laser device 100B includes a laser resonator 1B, the calculation unit 4, the control unit 5, the storage unit 6, and the driving power source 7.

The laser resonator 1B includes the laser diodes 40-1, 40-2, and 40-3, the partial reflective mirror 50, the wavelength dispersive element 60, and an output detecting unit 70B. The laser device 100B is identical to the laser device 100A except for including the output detecting unit 70B in place of the output detecting unit 70A of the laser device 100A, and therefore description of the identical part is omitted. Differences from the laser device 100A are mainly described below.

The output detecting unit 70B includes one beam damper 72 and a plurality of thermocouples 73a, 73b, and 73c. The beam damper 72 is placed across two or more optical paths of the two or more second laser light beams 20a, 20b, and 20c. The beam damper 72 is an absorber that absorbs the second laser light beams 20 with high efficiency and terminates the laser light beams. The two or more thermocouples 73a, 73b, and 73c are provided on the beam damper 72. In the following descriptions, the thermocouples 73a, 73b, and 73c are simply called "thermocouples 73" when it is not necessary to distinguish them from each other. For example, the number of the provided thermocouples 73 is the same as the number of the laser diodes 40, and the thermocouples 73 are provided on the optical paths of the second laser light beams 20, respectively. Specifically, the thermocouple 73a is placed on the optical path of the second laser light beam 20a, the thermocouple 73b is placed on the optical path of the second laser light beam 20b, and the thermocouple 73c is placed on the optical path of the second laser light beam 20c. When the second laser beams 20 are incident on the beam damper 72, the temperature of the beam damper 72 rises around points of incidence of the second laser light beams 20. The thermocouples 73 can detect this temperature change.

As described above, according to the laser device 100B of the second embodiment of the present invention, the output detecting unit 70B includes the beam damper 72 set across optical paths of the second laser light beams 20 and the thermocouples 73 provided on the optical paths of the second laser light beams 20, respectively, on the beam damper 72. Use of the output detecting unit 70B having this configuration enables the output detecting unit 70B to be manufactured more inexpensively as compared with the configuration of the output detecting unit 70A according to the first embodiment, so that the manufacturing cost of the device can be reduced. Further, according to the output detecting unit 70B, sensitivity change occurring in an output sensor used in the output detecting unit 70A is less. Therefore, it is possible to realize a detecting function stable for a longer term.

Third Embodiment

Figure 3:
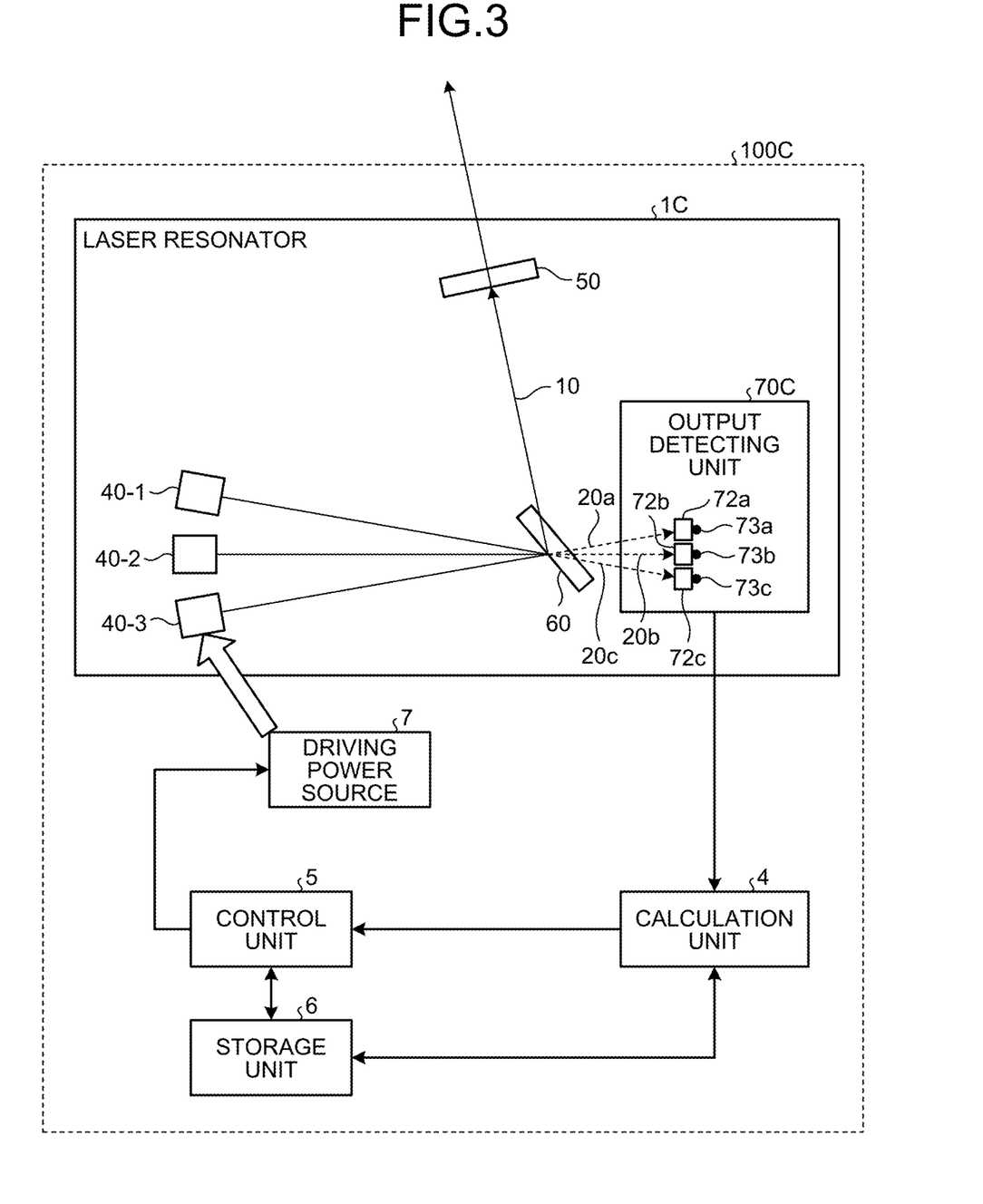
FIG. 3 is a diagram illustrating a configuration of a laser device according to a third embodiment of the present invention.

FIG. 3 is a diagram illustrating a configuration of a laser device 100C according to a third embodiment of the present invention. The laser device 100C includes a laser resonator 1C, the calculation unit 4, the control unit 5, the storage unit 6, and the driving power source 7.

The laser resonator 1C includes the laser diodes 40-1, 40-2, and 40-3, the partial reflective mirror 50, the wavelength dispersive element 60, and an output detecting unit 70C. The laser device 100C is identical to the laser device 100A except for including the output detecting unit 70C in place of the output detecting unit 70A of the laser device 100A, and therefore description of the identical part is omitted. Differences from the laser device 100A are mainly described below.

The output detecting unit 70C includes a plurality of beam dampers 72a, 72b, and 72c placed on optical paths of the second laser light beams 20, respectively, and the two or more thermocouples 73a, 73b, and 73c provided for the beam dampers 72a, 72b, and 72c, respectively. In other words, the output detecting unit 70C includes the beam dampers 72a, 72b, and 72c in place of the beam damper 72 of the output detecting unit 70B, and the thermocouples 73a, 73b, and 73c and the beam dampers 72a, 72b, and 72c are set in one-to-one correspondence. In the following descriptions, the beam dampers 72a, 72b, and 72c are simply called "beam dampers 72" when it is not necessary to distinguish them from each other.

As described above, according to the laser device 100C of the present third embodiment, the output detecting unit 70C of the laser device 100C includes a plurality of beam dampers 72 and a plurality of thermocouples 73. Use of the output detecting unit 70C having the configuration described above enables the output detecting unit 70C to be manufactured more inexpensively as compared with the configuration of the output detecting unit 70A according to the first embodiment, thereby making it possible to save the manufacturing cost of the device. Further, according to the output detecting unit 70C, sensitivity change occurring in an output sensor used in the output detecting unit 70A is less. Therefore, it is possible to realize a detecting function stable for a longer term.

Furthermore, the output detecting unit 70C of the laser device 100C includes the two or more beam dampers 72 placed on optical paths of the two or more second laser light beams 20, respectively, and the two or more thermocouples 73 provided for the beam dampers 72, respectively. In the output detecting unit 70B according to the second embodiment, because the second laser beams 20a, 20b, and 20c are incident on a single beam damper 72, regions where the temperature is increased by the second laser light beams 20 tend to overlap each other more easily, as positions of incidence of the second laser light beams 20 on the beam damper 72 are closer to each other. In contrast to the second embodiment, in the output detecting unit 70C, the second laser light beams 20a, 20b, and 20c are applied onto their respective beam dampers 72a, 72b, and 72c different from each other. Therefore, as compared with the output detecting unit 70B according to the second embodiment, accuracy in detection of the output of the second laser light beam 20 for each wavelength is improved.

Fourth Embodiment

Figure 4:
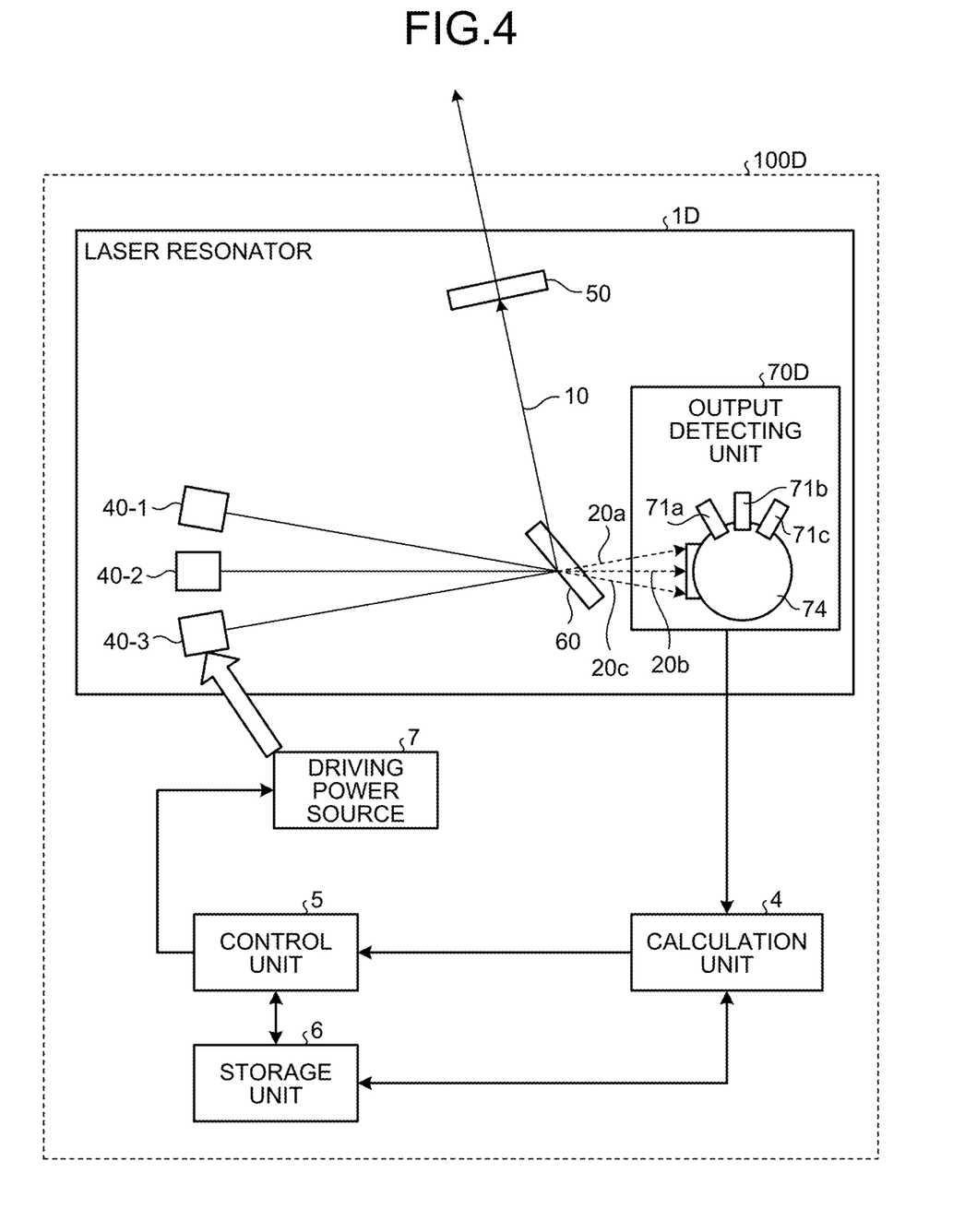
FIG. 4 is a diagram illustrating a configuration of a laser device according to a fourth embodiment of the present invention.

FIG. 4 is a diagram illustrating a configuration of a laser device 100D according to a fourth embodiment of the present invention. The laser device 100D includes a laser resonator 1D, the calculation unit 4, the control unit 5, the storage unit 6, and the driving power source 7.

The laser resonator 1D includes the laser diodes 40-1, 40-2, and 40-3, the partial reflective mirror 50, the wavelength dispersive element 60, and an output detecting unit 70D. The laser device 100D is identical to the laser device 100A except for including the output detecting unit 70D in place of the output detecting unit 70A of the laser device 100A, and therefore description of the identical part is omitted. Differences from the laser device 100A are mainly described below.

The output detecting unit 70D includes an integrating sphere 74 and the output measurement sensors 71a, 71b, and 71c provided on the integrating sphere 74. The second laser light beams 20a, 20b, and 20c are incident on the integrating sphere 74 from the wavelength dispersive element 60. The two or more output measurement sensors 71a, 71b, and 71c have their respective sensitivity characteristics different from each other, the sensitivity characteristics each showing the light-receiving sensitivity with respect to a wavelength of a laser light beam incident on the integrating sphere 74. Each of the output measurement sensors 71a, 71b, and 71c outputs a detection signal indicating the intensity of corresponding one of the laser light beams incident on the integrating sphere 74 to the calculation unit 4 in accordance with the intensity of that laser light beam and its own sensitivity characteristic.

The laser light beams incident on the integrating sphere 74 are diffused inside the integrating sphere 74, and are thereafter applied onto light-receiving surfaces of the output measurement sensors 71a, 71b, and 71c, respectively. Therefore, the intensities of the laser light beams respectively applied to the output measurement sensors 71a, 71b, and 71c are made uniform. Accordingly, output measurement accuracy of each of the output measurement sensors 71a, 71b, and 71c is improved.

As described above, in the output detecting unit 70D according to the fourth embodiment of the present invention, the output measurement sensors 71a, 71b, and 71c measure the intensities of the second laser light beams 20a, 20b, and 20c in a state where the second laser light beams 20a, 20b, and 20c are diffused in an inner portion of the integrating sphere 74 and the intensities thereof are uniformalized. Accordingly, output measurement accuracy of each of the output measurement sensors 71a, 71b, and 71c is improved.

Fifth Embodiment

Figure 5:
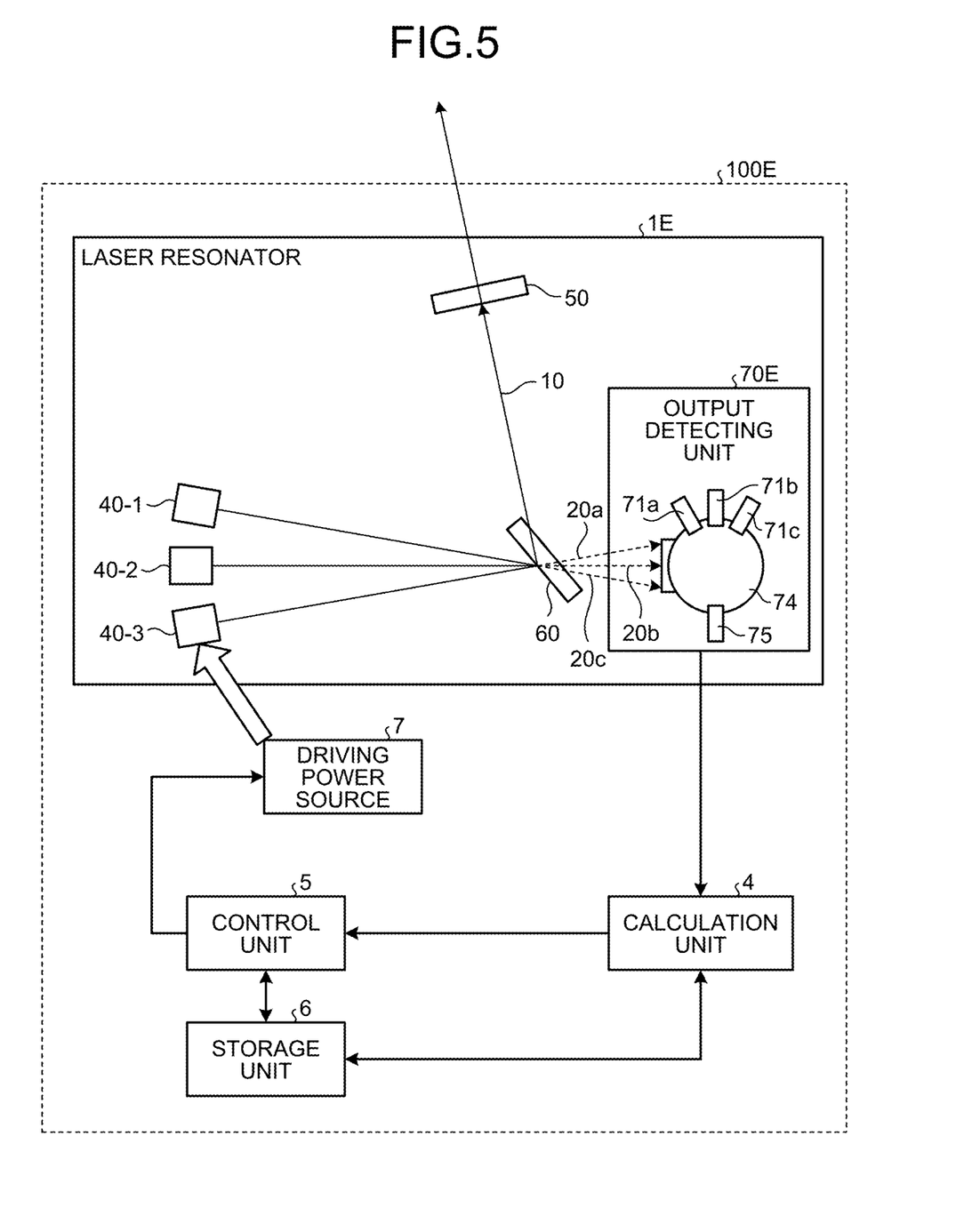
FIG. 5 is a diagram illustrating a configuration of a laser device according to a fifth embodiment of the present invention.

FIG. 5 is a diagram illustrating a configuration of a laser device 100E according to a fifth embodiment of the present invention. The laser device 100E includes a laser resonator 1E, the calculation unit 4, the control unit 5, the storage unit 6, and the driving power source 7.

The laser resonator 1E includes the laser diodes 40-1, 40-2, and 40-3, the partial reflective mirror 50, the wavelength dispersive element 60, and an output detecting unit 70E. The laser device 100E is identical to the laser device 100D except for including the output detecting unit 70E in place of the output detecting unit 70D of the laser device 100D, and therefore description of the identical part is omitted. Differences from the laser device 100D are mainly described below.

The output detecting unit 70E includes the output measurement sensors 71a, 71b, and 71c, the integrating sphere 74, and a thermal sensor 75. In other words, the output detecting unit 70E includes the thermal sensor 75 in addition to the configuration of the output detecting unit 70D. The thermal sensor 75 is a sensor for detecting the intensity of a laser output based on temperature change. The sensor output of the thermal sensor 75 is less changed, as compared with those of the output measurement sensors 71a, 71b, and 71c. Therefore, the output of the thermal sensor 75 is inputted to the calculation unit 4 and is regularly used for calibration of the sensor outputs of the output measurement sensors 71a, 71b, and 71c.

As described above, according to the laser device 100E of the fifth embodiment of the present invention, the output detecting unit 70E regularly calibrates the sensor outputs of the output measurement sensors 71a, 71b, and 71c using the thermal sensor 75. Therefore, it is possible to improve output measurement accuracy of each of the output measurement sensors 71a, 71b, and 71c.

Figure 6:
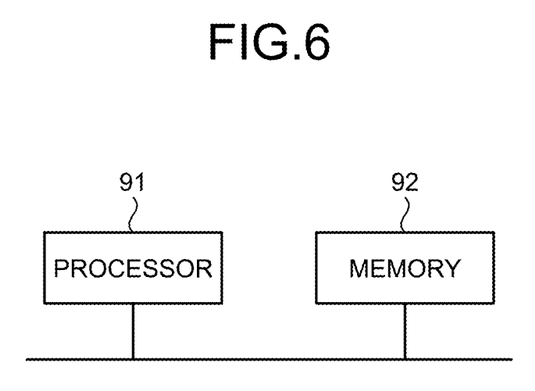
FIG. 6 is a diagram illustrating a hardware configuration of the laser devices according to the first to fifth embodiments of the present invention.

FIG. 6 is a diagram illustrating a hardware configuration of the laser devices 100A to 100E according to the first to fifth embodiments of the present invention. The calculation unit 4, the control unit 5, and the storage unit 6 included in each of the laser devices 100A to 100E can be implemented by using a processor 91 and a memory 92.

The processor 91 is a CPU (Central Processing Unit, also referred to as a central processor, a processing device, an arithmetic device, a microprocessor, a microcomputer, a processor, or a DSP (Digital Signal Processor)) or a system LSI (Large Scale Integration).

The memory 92 corresponds to a semiconductor memory such as a RAM (Random Access Memory), a ROM (Read Only Memory), a flash memory, an EPROM (Erasable Programmable Read Only Memory), or an EEPROM [registered trademark] (Electrically Erasable Programmable Read Only Memory). The semiconductor memory may be a nonvolatile memory or a volatile memory. Other than a semiconductor memory, the memory 92 may be a magnetic disk, a flexible disk, an optical disk, a compact disk, a MiniDisk, or a DVD (Digital Versatile Disk).

As a computer program for performing processes for the calculation unit 4 and the control unit 5 is stored in the memory 92 and the processor 91 reads and executes the computer program, the functions of the calculation unit 4 and the control unit 5 are realized.

The configurations described in the above embodiments are only examples of the content of the present invention, and can be combined with other publicly known techniques and partially omitted and/or modified without departing from the scope of the present invention.

For example, although the wavelength dispersive element 60 is a transmission type diffraction grating in the drawings of the embodiments described above, the wavelength dispersive element 60 of a reflective type may be used. For example, first-order diffracted light beams are used as the first laser light beam 10 and zero-order diffracted light beams are used as the second laser light beams 20 in the embodiments described above, but diffracted light beams of any order may be used as each of the first laser light beam 10 and the second laser light beams 20 in accordance with the configuration of an optical resonator.

REFERENCE SIGNS LIST 1A, 1B, 1C laser resonator; 4 calculation unit, control unit; 6 storage unit; 7 driving power source; 10 first laser light beam; 20, 20a, 20b, 20c second laser light beam; 40, 40-1, 40-2, 40-3 laser diode; 50 partial reflective mirror; 60 wavelength dispersive element; 70A, 70B, 70C, 70D, 70E output detecting unit; 71a, 71b, 71c output measurement sensor; 72 beam damper; 73a, 73b, 73c thermocouple; 74 integrating sphere; 75 thermal sensor; 100A, 100B, 100C, 100D, 100E laser device.

The invention claimed is:

1. A laser device comprising:
a plurality of laser diodes to generate laser light beams having their respective wavelengths different from each other;
a partial reflective mirror by which a resonator is formed along with the laser diodes;
a wavelength dispersive element placed in the resonator, to combine parts of the laser light beams outputted by the laser diodes with each other, emit the laser light beams obtained by the combination as a first laser light beam toward the partial reflective mirror, and emit other parts of the laser light beams as second laser light beams in directions different from the direction toward the partial reflective mirror; and
an output detecting unit in which a beam damper placed across two or more optical paths of the second laser light beams and a plurality of thermocouples provided on the optical paths of the second laser light beams, respectively, on the beam damper are included, to detect intensities of the second laser light beams.

2. A laser device comprising:
a plurality of laser diodes to generate laser light beams having their respective wavelengths different from each other;
a partial reflective mirror by which a resonator is formed along with the laser diodes;
a wavelength dispersive element placed in the resonator, to combine parts of the laser light beams outputted by the laser diodes with each other, emit the laser light beams obtained by the combination as a first laser light beam toward the partial reflective mirror, and emit other parts of the laser light beams as second laser light beams in directions different from the direction toward the partial reflective mirror; and
an output detecting unit in which a plurality of beam dampers placed on optical paths of the second laser light beams, respectively, and a plurality of thermocouples provided for the beam dampers, respectively are included, to detect intensities of the second laser light beams.

3. A laser device comprising:
a plurality of laser diodes to generate laser light beams having their respective wavelengths different from each other;
a partial reflective mirror by which a resonator is formed along with the laser diodes;
a wavelength dispersive element placed in the resonator, to combine parts of the laser light beams outputted by the laser diodes with each other, emit the laser light beams obtained by the combination as a first laser light beam toward the partial reflective mirror, and emit other parts of the laser light beams as second laser light beams in directions different from the direction toward the partial reflective mirror; and
an output detecting unit includes in which an integrating sphere and a plurality of output measurement sensors provided on the integrating sphere to detect each of intensities of the second laser light beams are included, in which
the output measurement sensors detect the intensities of the second laser light beams diffused inside the integrating sphere, respectively.

4. The laser device according to claim 3, wherein
the output detecting unit further includes a thermal sensor provided on the integrating sphere, and calibration of the output measurement sensors is performed based on a detection value of the thermal sensor.

5. The laser device according to claim 1, wherein outputs of the laser diodes are controlled based on the intensities of the second laser light beams measured by the output detecting unit.

6. The laser device according to claim 1, wherein the intensities of the second laser light beams measured by the output detecting unit are recorded as state information of the laser device.

7. The laser device according to claim 1, wherein abnormality of the laser device is detected based on the intensities of the second laser light beams measured by the output detecting unit, and when abnormality of the laser device is detected, the laser device makes notification of the abnormality or causes the laser device to be stopped.

8. The laser device according to claim 1, wherein
the first laser light beam is a light ray transmitted through the wavelength dispersive element and the second laser light beams are light rays reflected by the wavelength dispersive element, or
the first laser light beam is a light ray reflected by the wavelength dispersive element and the second laser light beams are light rays transmitted through the wavelength dispersive element.

9. The laser device according to claim 2, wherein outputs of the laser diodes are controlled based on the intensities of the second laser light beams measured by the output detecting unit.

10. The laser device according to claim 3, wherein outputs of the laser diodes are controlled based on the intensities of the second laser light beams measured by the output detecting unit.

11. The laser device according to claim 2, wherein the intensities of the second laser light beams measured by the output detecting unit are recorded as state information of the laser device.

12. The laser device according to claim 3, wherein the intensities of the second laser light beams measured by the output detecting unit are recorded as state information of the laser device.

13. The laser device according to claim 2, wherein abnormality of the laser device is detected based on the intensities of the second laser light beams measured by the output detecting unit, and when abnormality of the laser device is detected, the laser device makes notification of the abnormality or causes the laser device to be stopped.

14. The laser device according to claim 3, wherein abnormality of the laser device is detected based on the intensities of the second laser light beams measured by the output detecting unit, and when abnormality of the laser device is detected, the laser device makes notification of the abnormality or causes the laser device to be stopped.

15. The laser device according to claim 2, wherein
the first laser light beam is a light ray transmitted through the wavelength dispersive element and the second laser light beams are light rays reflected by the wavelength dispersive element, or
the first laser light beam is a light ray reflected by the wavelength dispersive element and the second laser light beams are light rays transmitted through the wavelength dispersive element.

16. The laser device according to claim 3, wherein
the first laser light beam is a light ray transmitted through the wavelength dispersive element and the second laser light beams are light rays reflected by the wavelength dispersive element, or
the first laser light beam is a light ray reflected by the wavelength dispersive element and the second laser light beams are light rays transmitted through the wavelength dispersive element.

\* \* \* \* \*